United States Patent
Sammakia et al.

[19]

[11] Patent Number: 5,912,800

[45] Date of Patent: Jun. 15, 1999

[54] ELECTRONIC PACKAGES AND METHOD TO ENHANCE THE PASSIVE THERMAL MANAGEMENT OF ELECTRONIC PACKAGES

[75] Inventors: Bahgat Ghaleb Sammakia, Newark Valley; Sanjeev Balwant Sathe, Johnson City, both of N.Y.

[73] Assignee: International Business Machines Corporation, Armonk, N.Y.

[21] Appl. No.: 08/923,007

[22] Filed: Sep. 3, 1997

[51] Int. Cl.$^6$ ........................................... H05K 7/20
[52] U.S. Cl. ..................... 361/690; 361/697; 361/704; 361/709; 361/710; 174/15.1; 174/16.1; 174/52.4; 174/35 R; 165/80.2; 165/80.3; 165/185
[58] Field of Search ............................ 361/683, 685, 361/687, 678, 690–697, 700–710, 712–718, 725, 736, 752, 813; 257/712, 718; 165/80.3, 80.4, 146, 80.1, 185, 121; 174/16.3, 52.4, 35 MS, 35 R

[56] References Cited

U.S. PATENT DOCUMENTS

| | | |
|---|---|---|
| 4,980,848 | 12/1990 | Griffin et al. ........................... 364/708 |
| 5,021,924 | 6/1991 | Kieda et al. . |
| 5,022,462 | 6/1991 | Flint et al. . |
| 5,091,827 | 2/1992 | Suret et al. ............................ 361/424 |
| 5,132,874 | 7/1992 | Chandler et al. ....................... 361/386 |
| 5,313,362 | 5/1994 | Hatada et al. .......................... 361/709 |
| 5,467,815 | 11/1995 | Haumann et al. . |
| 5,592,363 | 1/1997 | Atarashi et al. . |
| 5,604,665 | 2/1997 | Chrysler et al. . |

*Primary Examiner*—Leo P. Picard
*Assistant Examiner*—Michael Datskovsky
*Attorney, Agent, or Firm*—Scully, Scott,Murphy & Presser; Lawrence R. Fraley, Esq.

[57] ABSTRACT

A method of enhancing the passive thermal management of electronic packages, and an electronic package consisting of a vertically-oriented substrate, such as a printed circuit board or the like, a heat-generating electronic module, for example, containing at least one chip which is positioned on a substrate, and a cover plate located adjacent to the module at a predetermined spaced relationship therefrom. The cover plate includes at least one opening located adjacent the module at a predetermined location relative thereto so as to ensure a maximum cooling air flow impinging on the module, and which air flow thereafter passes upwardly between the substrate and the cover plate. The cover plate may be equipped with a heat-sink structure, such as fins, for cooling the module, which structure is adapted to project through the opening formed in the cover plate or to lie flush therewith.

16 Claims, 1 Drawing Sheet

ELECTRONIC PACKAGES AND METHOD TO ENHANCE THE PASSIVE THERMAL MANAGEMENT OF ELECTRONIC PACKAGES

BACKGROUND OF THE DISCLOSURE

1. Field of the Invention

The present invention relates to a method of enhancing the passive thermal management of electronic packages. Moreover, the invention is directed to the provision of an electronic package consisting of a vertically-oriented substrate, such as a printed circuit board or the like, a heat-generating electronic module, for example, containing at least one chip which is positioned on a substrate, and a cover plate located adjacent to the module at a predetermined spaced relationship therefrom. The cover plate includes at least one opening located adjacent the module at a predetermined location relative thereto so as to ensure a maximum cooling air flow impinging on the module, and which air flow thereafter passes upwardly between the substrate and the cover plate. Pursuant to a further aspect of the invention, the latter is directed to the provision of a heat-sink structure for the module, which is adapted to project through the opening formed in the cover plate or to lie flush therewith.

In passive thermal management, or essentially natural convective cooling of electronic packages, reliance is normally placed on a buoyancy-induced air flow around a heated module in order to thermally manage or regulate the temperature of the module during operation of the electronic package. The air flow is propagated on the basis of the phenomenon that warm air possesses a lower density than the surrounding cold air, and therefore will attempt to flow upwardly. This results in the cold air from the surroundings being drawn in and upwardly as a replacement for the warm air, thereby generating a buoyancy-induced, or natural convection air flow. This type of passive thermal management is extremely desirable wherever it can be applied inasmuch as it does not require the utilization of any external energy source to induce the air flow. Furthermore, such a physical set-up, or construction is extremely reliable inasmuch as there is no necessity for the provision of fans or blowers, and the therewith associated costs and potential equipment failures. However, a problem which is encountered is that natural convection air flows are typically weak; in effect, the flow velocity and flow rate are low and also is not well-controlled so that the exact nature of the flow regime or course is by default, rather than by design.

In order to obviate the drawbacks and limitations encountered in the aspect of providing adequate cooling of electronic packages during operation thereof through passive thermal management or natural convection, the air flow is controlled in order to optimize heat transfer from the locations which are of interest, essentially from the module. This is of particular significance in portable systems, such as laptops, where energy, space and weight are severely restricted, thus rendering the use of forced convection undesirable from the standpoint of space, weight and expensive equipment having to be installed in such laptops or similar portable or personal computers.

2. Field of the Prior Art

Although various publications are currently in existence in the technology which are directed to different aspects in providing cooling to electronic packages in order to impart thermal management thereof, these are primarily directed to the so-called forced convection or air flow arrangements, which are cumbersome and space-consuming, energy operated and expensive to install and maintain, while being subject to equipment failure.

U.S. Pat. No. 5,021,924, to Kieda et al., discloses a semiconductor cooling device including a forced convection impingement arrangement for a multi-chip module. There is no disclosure of a natural convection or passive thermal management method for electronic packages.

U.S. Pat. No. 5,467,815, to Haumann et al., discloses an apparatus for impingement cooling including a trapezoidal heat-sink array for the forced convection impingement cooling of a surface. This is a fundamentally differing arrangement with respect to the present natural convection, or passive thermal management, of electronic packages.

U.S. Pat. No. 5,592,363, to Atarashi et al., pertains to an electronic apparatus which incorporates a forced convection thermal management system similar to that of U.S. Pat. No. 5,021,924 and does not direct itself to the natural convection cooling, or passive thermal management, of electronic packages.

U.S. Pat. No. 5,604,665, to Chrysler et al., pertains to a forced convection impingement cooling system for multi-components which includes the ability to tune thermal performance through the use of flow restrictions. This is distinct from the natural convection, or passive thermal management method for electronic packages, as in the present invention.

U.S. Pat. No. 5,022,462, to Flint et al., discloses a flexible finned heat exchanger which utilizes a forced convection air flow for multi-chip applications, and does not define the passive thermal management, or natural convection cooling, of electronic packages.

SUMMARY OF THE INVENTION

In summation, the inventive concept is predicated on the control of inlets and outlets of an actual convection air flow in relation to a module or modules in the positions which are to be thermally managed. In the instance of a heated module which is attached to a vertical board, such as a printed circuit board or the like, it can be ascertained that the transfer of heat from the module is significantly improved by positioning a cover plate in parallel with the printed circuit board and in spaced relationship to the module or modules which is or are located within a channel or air flow passage formed between the jointed circuit board and the cover plate, and in which at least one opening is provided in the cover plate facilitating the entry of cold air into the channel between the cover plate and the printed circuit board and impinging against the module or modules, with the heated air about the module or modules being buoyantly upwardly directed and replaced by an incoming, continuous flow of cooler air.

Accordingly, it is an object of the present invention to provide an arrangement for the passive thermal management, or natural convective cooling of electronic packages.

Another object of the present invention resides in the provision of a method of enhancing the passive thermal management of electronic packages.

BRIEF DESCRIPTION OF THE DRAWINGS

Reference may now be had to the following detailed description of preferred embodiments of the invention, taken in conjunction with the accompanying drawings; in which.

DETAILED DESCRIPTION

Figure 1A:
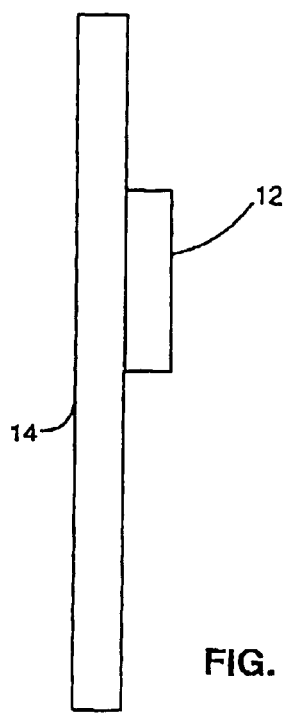
FIG. 1a illustrates an electronic package, such as a semiconductor chip being positioned on a vertical substrate, such as a printed circuit board.
Figure 1B:
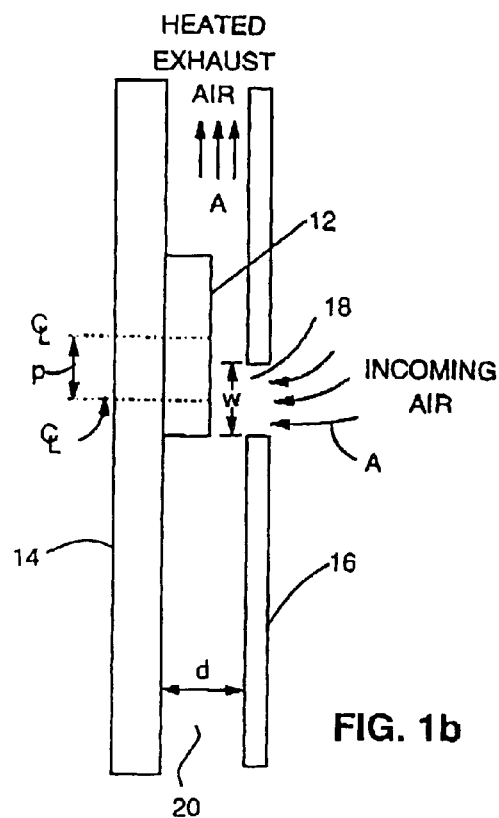
FIG. 1b illustrates the arrangement of FIG. 1a incorporating a cover plate at a predetermined spaced relationship relative to the printed circuit board and electronic package and including a specified opening at a location to impart a natural convective cooling air flow into the space between the cover plate and printed circuit board for cooling the electronic package.

Referring specifically to the drawings, and in particular FIGS. 1a and 1b, FIG. 1a illustrates an electronic package comprising a semiconductor chip 12 which is adapted to be mounted on a substrate, for example, such as a printed circuit board 14. The arrangement is adapted to be vertically oriented during utilization, such as being in the back or display panel of a laptop or portable personal computer (not shown), and wherein energy, space and weight restrictions render the use of forced convection through the intermediary of fans or blowers to be undesirable.

In order to provide for the thermal management, or natural convection of an air flow for cooling a heated module or an electronic package 12 attached to the vertical board 14, as illustrated in FIG. 1b of the drawing, heat transfer from the electronic package can be significantly improved by positioning a cover plate 16 in parallel spaced relationship with the substrate or printed circuit board 14. An opening 18 is formed in the cover plate, which enables cold air to enter into the passage or channel 20 formed between the printed circuit board and the cover plate and to flow in the direction of arrow A so as to impinge against the electronic package or module 12, whereby the flow of the air will cause the air which has been absorbing heat from the electronic package 12 to be buoyantly conducted upwardly and away from the electronic package and replaced by the cooler air flowing into the channel 20 through the opening 18 in the cover plate 16.

Pursuant to a specific aspect of the invention, it is important that the location of the opening 18 in the cover plate 16 be precisely correlated with the positioning of the module or electronic package relative to the opening, and with the width of the channel 20 present between the cover plate 16 and the printed circuit board 14 mounting the electronic package 12, and also the dimensions of the opening itself in the cover plate. In this connection, the horizontal center line of the electronic package 12 is offset upwardly or vertically from the horizontal center line of the opening 18 in the cover plate 16 by the dimension "p", with the width of the channel or passage 20 between the cover plate 16 and the printed circuit board 14 being defined as "d", and the height or vertical dimension of the opening 18 in the cover plate being defined by "w."

The data as set forth hereinbelow in Table I concenring the above parameters represents the magnitude of the improvement obtained by the foregoing:

TABLE I

Module Temperature Rise From Ambient for Different Shroud (Cover Plate) Openings and Distances

| p(mm) | w(mm) | d(mm) | Temp. Rise(C) |
|---|---|---|---|
| 20 | 20 | infinity | 99 (no cover plate) |
| 20 | 20 | 15 | 94 |
| 20 | 20 | 10 | 90.1 |
| 20 | 20 | 9 | 89 |
| 20 | 10 | 9 | 98 |

Module Heat Flux = 1000 W/m**2
Module Length = 50 mm
Results From Numerical CFD Simulations Although the above configurations do not represent a fully-optimized situation, even the limited simulations show that the appropriate choice of opening 18 in the cover plate, the distance of the cover plate 16 to the printed circuit board 14, in effect, the width of the channel 20, can result in a 10° cooler module 12, with the reliability of semiconductor devices increasing considerably with lower temperatures.

Figure 2:
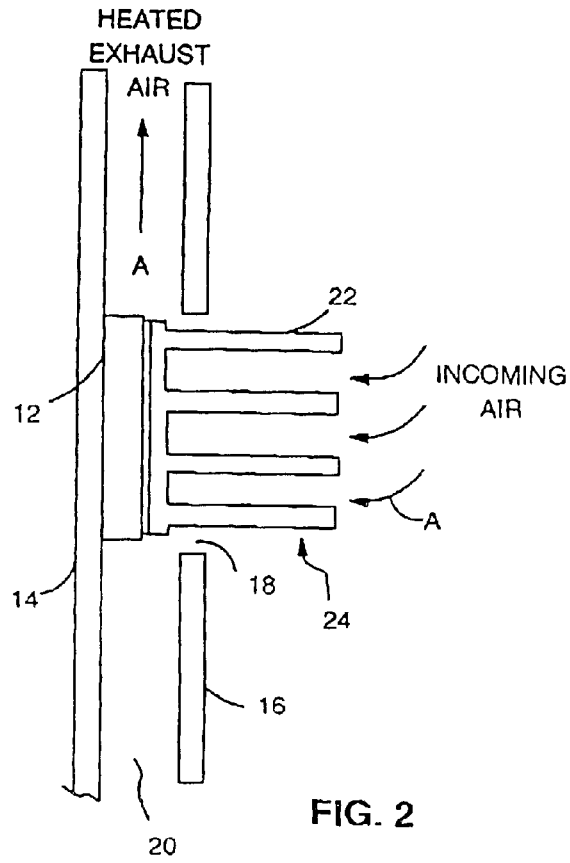
FIG. 2 illustrates a further embodiment of the inventive arrangement for the passive thermal management of electronic packages.

Reverting to the embodiment of FIG. 2 of the drawings, in that instance, the opening 18 in the cover plate 16 is dimensioned so as to be substantially coextensive with the vertical height of the electronic package 12 which is mounted on the vertically-oriented printed circuit board 14, and whereby a plurality of horizontally-oriented parallel spaced cooling fins 22 are arranged to extend from close proximity to the electronic package within channel 20 outwardly through the opening in the cover plate, so as to produce a heat-sink structure 24 which is attached to the module or electronic package 12. In that instance, the heat sink structure 24 and air flow entrance or opening location would be optimized to maximize the flow or transference of heat out of the electronic package or module.

Figure 3:
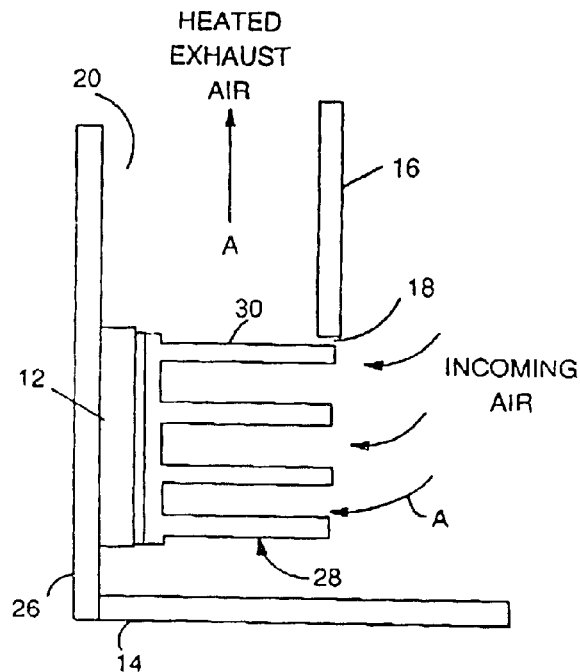
FIG. 3 illustrates a third embodiment of an arrangement for the passive thermal management or convective cooling of electronic packages.

FIG. 3 illustrates a modified embodiment of a computer showing a horizontal printed circuit board or substrate 14 with a module 12 attached in a vertical orientation to a back panel 26, and with a heat-sink 28 possessing a plurality of horizontal fins 30 being connected directly above the panel within channel 20. In this case, the cold air from the surroundings enters directly toward the electronic package or module 12, and then exits through the channel 20 between the cover plate 16 and the panel 26 having the module mounted thereon, in an upward buoyant flow. directly upwardly. This may produce the advantage of maximizing a temperature differential at a low pressure drop.

From the foregoing, it becomes readily apparent to one skilled in the art that the invention is directed to a simple arrangement and method for the thermal management or natural convective cooling of electronic packages.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. An arrangement for the passive thermal management of an electronic package in a personal computer through a natural convective air flow, said electronic package being supported on a generally vertical oriented substrate formed by an upstanding surface structure of said computer, said arrangement comprising a cover plate extending parallel spaced with said substrate so as to form a vertical channel having said electronic package positioned therein, an opening being formed in said cover plate in predetermined horizontally and vertically spaced facing relationship with said electronic package, and a heat sink extending through said opening in said cover plate into proximity with said electronic package so as to facilitate a cool air flow to be drawn into said channel and extend about exposed surfaces of said electronic package replacing heated air buoyantly drawn upwardly through said channel from said electronic package.

2. An arrangement as claimed in claim 1, wherein said heat sink comprises a plurality of parallel spaced fin elements.

3. An arrangement as claimed in claim 2, wherein said fin elements include portions extending outwardly of said channel through the opening in said cover plate.

4. An arrangement as claimed in claim 2, wherein said fin elements extend within the confines of said channel.

5. An arrangement as claimed in claim 2, wherein said fin elements extend generally transversely of the vertical orientation of said channel.

6. An arrangement as claimed in claim 1, wherein said substrate supporting said electronic package comprises a printed circuit board.

7. An arrangement as claimed in claim 1, wherein said computer comprises a laptop computer.

8. An arrangement as claimed in claim 1, wherein said opening is formed at a bottom end of said cover plate adjacent a horizontal surface structure.

9. A method for the passive thermal management of an electronic package in a personal computer through a natural convective air flow, said electronic package being supported on a generally vertical oriented substrate formed by an upstanding surface structure of said computer, said method comprising positioning a cover plate extending parallel spaced with said substrate so as to form a vertical channel having said electronic package positioned therein, an opening being formed in said cover plate in predetermined horizontally and vertically spaced facing relationship with said electronic package, and a heat sink extending through said opening in said cover plate into proximity with said electronic package so as to facilitate a cool air flow to be drawn into said channel and extend about said electronic package replacing heated air buoyantly drawn upwardly through said channel from said electronic package.

10. A method as claimed in claim 9, wherein said heat sink comprises a plurality of parallel spaced fin elements.

11. A method as claimed in claim 10, wherein said fin elements include portions extending outwardly of said channel through the opening in said cover plate.

12. A method as claimed in claim 10, wherein said fin elements extend within the confines of said channel.

13. A method as claimed in claim 10, wherein said fin elements extend generally transversely of the vertical orientation of said channel.

14. A method as claimed in claim 9, wherein said substrate supporting said electronic package comprises a printed circuit board.

15. A method as claimed in claim 9, wherein said computer comprises a laptop computer.

16. A method as claimed in claim 9, wherein said opening is formed at a bottom end of said cover plate adjacent a horizontal surface structure.

* * * * *